United States Patent [19]

Konishi et al.

[11] Patent Number: 4,727,505

[45] Date of Patent: Feb. 23, 1988

[54] CONVOLUTION ARITHMETIC CIRCUIT FOR DIGITAL SIGNAL PROCESSING

[75] Inventors: Kazuo Konishi, Tokyo; Meisei Nishikawa, Musashino, both of Japan

[73] Assignee: Kabushiki Kaisha Toshiba, Kawasaki, Japan

[21] Appl. No.: 716,950

[22] Filed: Mar. 28, 1985

[30] Foreign Application Priority Data

Mar. 29, 1984 [JP] Japan .................................. 59-59450
Mar. 29, 1984 [JP] Japan .................................. 59-59452

[51] Int. Cl.⁴ .............................................. G06F 7/38
[52] U.S. Cl. ..................................................... 364/728
[58] Field of Search ........................................ 364/728

[56] References Cited

U.S. PATENT DOCUMENTS

| | | |
|---|---|---|
| 3,748,451 | 7/1973 | Ingwersen .......................... 364/728 |
| 3,872,290 | 3/1975 | Crooke et al. ...................... 364/724 |
| 3,980,873 | 9/1976 | Mattei ............................ 364/728 X |
| 4,025,772 | 5/1977 | Constant ............................ 364/728 |
| 4,063,082 | 12/1977 | Nussbaumer ..................... 364/728 |
| 4,490,805 | 12/1984 | Tamura ............................. 364/728 |
| 4,573,136 | 2/1986 | Rossiter ............................ 364/728 |

OTHER PUBLICATIONS

Musen to Jikken, "*FIR Filter and Digital Signal Processing*"Special Edition, Nov. 20, 1979, pp. 89–96.

Finn, "*LSI Hardware Implements Signal Processing Algorithms*"Computer Design, Mar. 1980, pp. 137–139.

*Primary Examiner*—Gary V. Harkcom
*Assistant Examiner*—Tan V. Mai
*Attorney, Agent, or Firm*—Finnegan, Henderson, Farabow, Garrett & Dunner

[57] ABSTRACT

A convolution arithmetic circuit has a multiplier/accumulator to multiply two digital data sequences and add up the products. The sequences are stored in memories which cycle at the same rates and with different scales. One memory containing the multiplicand data is periodically updated, while the other memory containing coefficient data has a storage capacity of about twice the previous memory.

8 Claims, 15 Drawing Figures

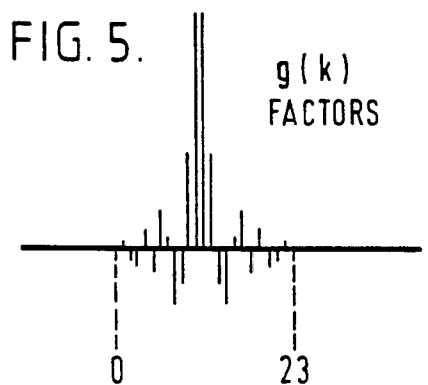
FIG. 5.
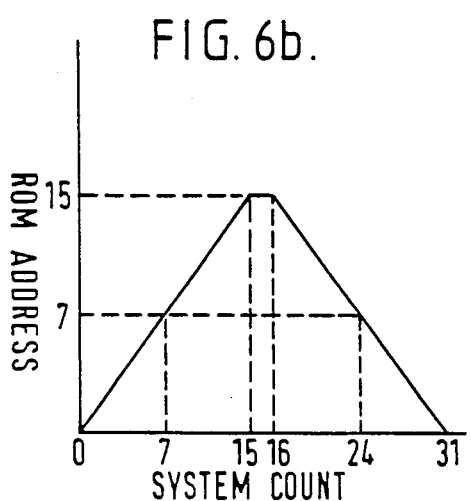
FIG. 6b.
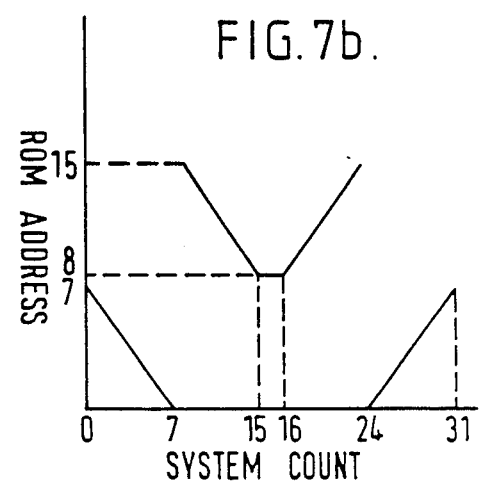
FIG. 7b.
FIG. 8.
| ROM 42 ADDRESS | g(k) FACTORS |
| --- | --- |
| 0 | 3, 20 |
| 2 | 11, 12 |
| 3 | 7, 16 |
| 4 | 4, 19 |
| 5 | 8, 15 |
| 7 | 0, 23 |
| 8 | 2, 21 |
| 10 | 10, 13 |
| 11 | 6, 17 |
| 12 | 5, 18 |
| 13 | 9, 14 |
| 15 | 1, 22 |

| ROM 42a ADDRESS | g(k) FACTORS |
|---|---|
| 0 | 20 |
| 2 | 12 |
| 3 | 16 |
| 4 | 4 |
| 5 | 8 |
| 7 | 0 |
| 8 | 21 |
| 10 | 13 |
| 11 | 17 |
| 12 | 5 |
| 13 | 9 |
| 15 | 1 |
| 16 | 22 |
| 18 | 14 |
| 19 | 18 |
| 20 | 6 |
| 21 | 10 |
| 23 | 2 |
| 24 | 23 |
| 26 | 15 |
| 27 | 19 |
| 28 | 7 |
| 29 | 11 |
| 31 | 3 |

FIG. 10.

| ROM 42b ADDRESS | g(k) FACTORS |
|---|---|
| 0 | 23 |
| 2 | 15 |
| 3 | 19 |
| 4 | 7 |
| 5 | 11 |
| 7 | 3 |
| 8 | 22 |
| 10 | 14 |
| 11 | 18 |
| 12 | 6 |
| 13 | 10 |
| 15 | 2 |
| 16 | 21 |
| 18 | 13 |
| 19 | 17 |
| 20 | 5 |
| 21 | 9 |
| 23 | 1 |
| 24 | 20 |
| 26 | 12 |
| 27 | 16 |
| 28 | 4 |
| 29 | 8 |
| 31 | 0 |

FIG. 11.

CONVOLUTION ARITHMETIC CIRCUIT FOR DIGITAL SIGNAL PROCESSING

CROSS-REFERENCE TO RELATED APPLICATION

This case is related to application Ser. No. 674,844, filed Nov. 26, 1984 entitled "A convolution Arithmetic Circuit," naming as inventor Kazuo Konishi.

BACKGROUND OF THE INVENTION

1. Field of the Invention

This invention relates to a convolution arithmetic circuit for a digital signal processing system such as a digital filter.

2. Description of the Prior Art

In recent years, widespread use has been made of digital recording and playback units such as PCM recorders or DAD (digital audio disc) players utilizing PCM (pulse code modulation) techniques to enable audio equipment to have as high fidelity as possible. FIG. 1 is a diagram of a digital recording and playback system according to prior art configurations. An analog signal, such as an audio signal, is input through terminal 11 and lowpass filter 12 removes unwanted high-frequency components from that signal. The output of filter 12 is supplied to sample-hold circuit 13, which samples the analog signal at a sampling frequency prescribed for the unit (e.g., 44.1 KHz in the case of a DAD player), for conversion into a digital signal by A/D (analog to digital) converter 14. Digital processing circuit 15 adds an error correction code and digital modulation to the digitized signal which is then recorded on a recording medium 16 such as a tape or a disc.

The original digital signal is recovered by digital demodulation processing circuit 17 which demodulates the playback signal from recording medium 16 and performs error correction for errors resulting from, for example, defects in the recording medium 16. The digital signal is extracted as a continuous analog signal, i.e., the original audio signal, from the output terminal 20, after removing the high-frequency noise component by low-pass filter 19, and after step-wise conversion to an analog signal by D/A (digital to analog) converter 18.

When the analog signal is recovered by sampling using this digital recording and playback unit, high-frequency components biased about the sampling frequency are generated resulting in a high-frequency distribution near the upper limit of the original frequency band. Low-pass filter 19 must therefore have a steep filter characteristic to remove these components.

If a digital filter 21 is interposed after the A/D converter 14 or before the D/A converter 18 to remove the high-frequency components in the digital signal stage, the filter characteristic of the low-pass filter 19 need not be so steep.

Generally, there are two operations for providing digital data with a filtering characteristic. One is in the frequency domain and another is in the time domain. The former filtering operation is accomplished first by a fast Fourier translation (FFT) of an input digital data sequence x(t) in the time domain into digital data X(w) in the frequency domain. Then, by multiplying the digital data X(w) with a transmission function G(w) having a desired characteristic in the frequency domain, and finally by applying an inverse fast Fourier translation (IFFT) of the product Y(w)=X(w).G(w), an output data sequence y(t) is generated in the time domain. This digital filtering operation, however, cannot take place in real time if the input digital data sequence x(t) occupies a relatively long time. Furthermore, the FFT and IFFT hardware required is very complicated and large.

Another filtering operation uses a convolution algorithm between the input data sequence in the time domain x(t) and an impulse response sequence g(i) (i=0, 1, ..., m). The convolution algorithm for this filtering operation is expressed as follows:

$$y(t) = \Sigma g(i) \cdot x(t-i)$$

where y(t) represents a filtered output digital data sequence.

Conventional circuit arrangements for implementing the convolution algorithm are illustrated in FIGS. 2 and 3 and have been described in a paper entitled "FIR Filter and Digital Signal Processing", *Musen to Jikken*, Special Edition, issued on Nov. 20, 1979, pp.89-96. The circuit diagram shown in FIG. 2 is a basic arrangement for performing the convolution algorithm. In FIG. 2, input terminal 30 receives a digital data sequence x(t) consisting of a plurality of coded bytes (e.g., of 16 bits per byte) obtained through an analog-to-digital (A/D) conversion of an analog signal at sampling frequency w. The sequence x(t) is fed through a delay device 31 composed of N-1 delay elements $31_1$ through $31_{N-1}$, each imparting a delay time T equal to the sampling period $1/F_S$. The outputs x(t) to x(t−N+1) of the delay elements $31_1$ through $31_{N-1}$ are sent to multipliers $32_0$ through $32_{N-1}$ each having a corresponding filter coefficient g(i) (i=0, 1, ..., N−1) derived from a desired impulse response or frequency transfer function. The outputs of the multipliers $32_0$ through $32_{N-1}$ are sent to an adder 33 to give a digital output sequence y(t). Such a structure achieves the required filtering characteristics given the appropriate coefficient factors g(i). The circuit shown in FIG. 2, however, requires a large number of delay elements and multipliers to implement a convolution algorithm of higher order.

The circuit in FIG. 3 has been proposed in the previously mentioned November 1979 paper for improving the basic circuit shown in FIG. 2, and includes memories for storing an input data sequence x(t) and corresponding filter coefficients g(i). In FIG. 3, the set of coefficient data factors g(k), which are set beforehand, are stored in ROM (read-only memory) 31. These coefficient data factors g(k) are sequentially read from addresses provided by address counter 37 and the coefficient data are fed to multiplier/accumulator 33. The input signal x(t), which constitutes the other data sequence of the convolution arithmetic calculation, is supplied to input I from an external source at prescribed intervals. As shown in the drawing, the input signal x(t) may be applied to multiplier/accumulator 33 through switch 35 or to a data input terminal $D_{IN}$ of RAM (random access memory) 36. Switch 35 determines whether input signal x(t) is fed to multiplier/accumulator 33 directly or is stored in RAM 36 for later presentation to the accumulator. The RAM 36 stores the input signal x(t) at certain prescribed times and is normally in a read mode so as to supply the stored input signals to multiplier/accumulator 33 through switch 35. Both the designation of the operating mode (read/write) and the application of addresses to RAM 36 (via RAM Address Counter 34) are carried out by timing control circuit 32 which is operated by a software-driven microcomputer. The timing control circuit 32 also generates addresses for ROM 31 via ROM Address Counter 37 and further controls the operation mode of RAM 36 and the timing of multiplier/accumulator 33.

The calculation of $y(t) = \sum_{K=0}^{m} g(2k) x(t - k)$ will be considered to help explain the operation of the circuit shown in FIG. 3. First, timing control circuit 32 and counters 34 and 37 indicate the addresses to enable sequential output of the coefficient data factors g(2), g(4), . . . , g(2m) stored in ROM 31 and of the input signals x(t-1), x(t-2), . . . ,x(t-m) stored in RAM 36 according to the proper correspondence between g(2k) x(t-k). These data are supplied to multiplier/accumulator 33 where corresponding elements of both sequences are successively multiplied and the products added. During this time, a R/W (designating read/write) signal from the timing control circuit 32 is at the L (low) level so RAM 36 is in the read mode. The R/W signal is also applied to a control terminal (not shown) of switch 35, so that the path of the input signal x(t) from the external source is disabled.

Before timing control circuit 32 performs the above operation, or at a suitable time during its progress, the R/W signal changes to the H (high) level, putting RAM 36 into the write mode, and setting switch 35 to connect multiplier/accumulator 33 to the external source device so that the current input signal x(t) is fed both to multiplier/accumulator 33 and to RAM 36. Timing control circuit 32 simultaneously identifies the addresses of ROM 31 and RAM 36 so that the coefficient data factor g(k) corresponding to the input signal x(t) is read out from ROM 31 and the current input signal x(t) is stored at the prescribed address in RAM 36 ready for use in the next calculation. When the convolution algorithm $$y(t) = \sum_{K=0}^{m} g(2k), x(t - k)$$

has been performed, multiplier/accumulator 33 outputs the result of its convolution calculation in response to an output control signal from timing control circuit 32.

Thus, the conventional convolution arithmetic circuit involves storing, in prescribed locations in the memory, two sets of data relating to the convolution calculation between the input signal x(t) and the coefficient data g(k), and supplying these sequentially to a multiplier-/accumulator in accordance with a correspondence relationship, all these operations being controlled by a programmed microcomputer.

The above conventional convolution arithmetic circuit has a certain flexibility in that it makes use of a programmable microcomputer, but, if it were to be applied as a digital filter in, for example, a DAD system, problems would arise regarding the processing speed of the microcomputer software rendering the convolution arithmetic circuit unable to cope with the data flow.

This problem can have very dire consequences. Specifically, in a digital filter used in a digital recording and playback unit as described above, the input signal x(t) is sampled at the sampling interval before being input sequentially, so the convolution algorithm must be performed in real time. This causes higher order calculation since the sampling frequency of the coefficient data g(k) that is used in the convolution algorithm must be fairly high, due to the need to set a transmission function, i.e., a filter characteristic, for the digital filter that will enable it to deal with signals containing a large number of high-frequency components. Since, as mentioned above, all the address signals and operations must be controlled by the programmed microcomputer, the load on the CPU (central processing unit) of the microcomputer becomes too great to carry out the arithmetical processing in the required time intervals. Such problems increase as the complexity of the calculations increase, and these problems set limits on the signal processing capabilities that can be achieved in practice using such conventional convolution arithmetic systems.

SUMMARY OF THE INVENTION

One object of the invention is to provide a convolution arithmetic circuit suitable for real-time processing of digital signals.

Another object of the invention is to provide a convolution arithmetic circuit having a simple construction for selecting different convolution formulae for data to be calculated.

A convolution arithmetic circuit according to this invention comprises: first memory means for storing a first data sequence; second memory means for storing a second data sequence determined from an input signal; first counter means providing cycles of count data, each said cycle including a sequence of non-repeated counts; second counter means providing a series of addresses for the second memory, multiplying/accumulating means for computing a series of products by multiplying elements of the first data sequence read from the first memory means by elements of the second data sequence read from the second memory means and for determining the sum of the products; and means for transforming each cycle of the count data into a series of addresses for the first memory means, each series of addresses including a sequence wherein at least one address is generated twice.

A convolution arithmetic circuit according to another aspect of the invention includes first memory means for storing a first data sequence; second memory means for storing a second data sequence; third memory means for storing a third data sequence determined from an input signal; first counter means providing a series of first addresses for the first and second memory means; second counter means providing a series of second addresses for the third memory means; selection means for selectively supplying an output representing either the first or second data sequence read from the first or second memory in response to said first addresses; and multiplying/accumulating means for computing a series of products by multiplying elements of the third data sequence read from the third memory by the data sequence supplied by said selection means and for determining the sum of the products.

BRIEF DESCRIPTION OF THE DRAWINGS

FIG. 5 is a graph showing impulse responses representing coefficient data factors of a digital filter.

FIG. 6b is a graph showing the relation of ROM addresses to the counts of the system counter, illustrating the operation shown in FIG. 6a.

FIG. 7b is a graph showing a different relation of ROM addresses to the counts of the system counter, illustrating the operation shown in FIG. 7a.

FIG. 8 is a tabulation of the storage location within ROM 42 (FIG. 4) of the various filtering coefficient data factor values depicted in FIG. 5.

FIGS. 10 and 11 are diagrams showing the storage locations of the various filter coefficient data factor values stored at the storage locations of ROM 42a and ROM 42b, respectively, as shown in FIG. 9.

DETAILED DESCRIPTION OF THE EMBODIMENTS

Embodiments of the present invention are described below with reference to the accompanying drawings.

Figure 1:
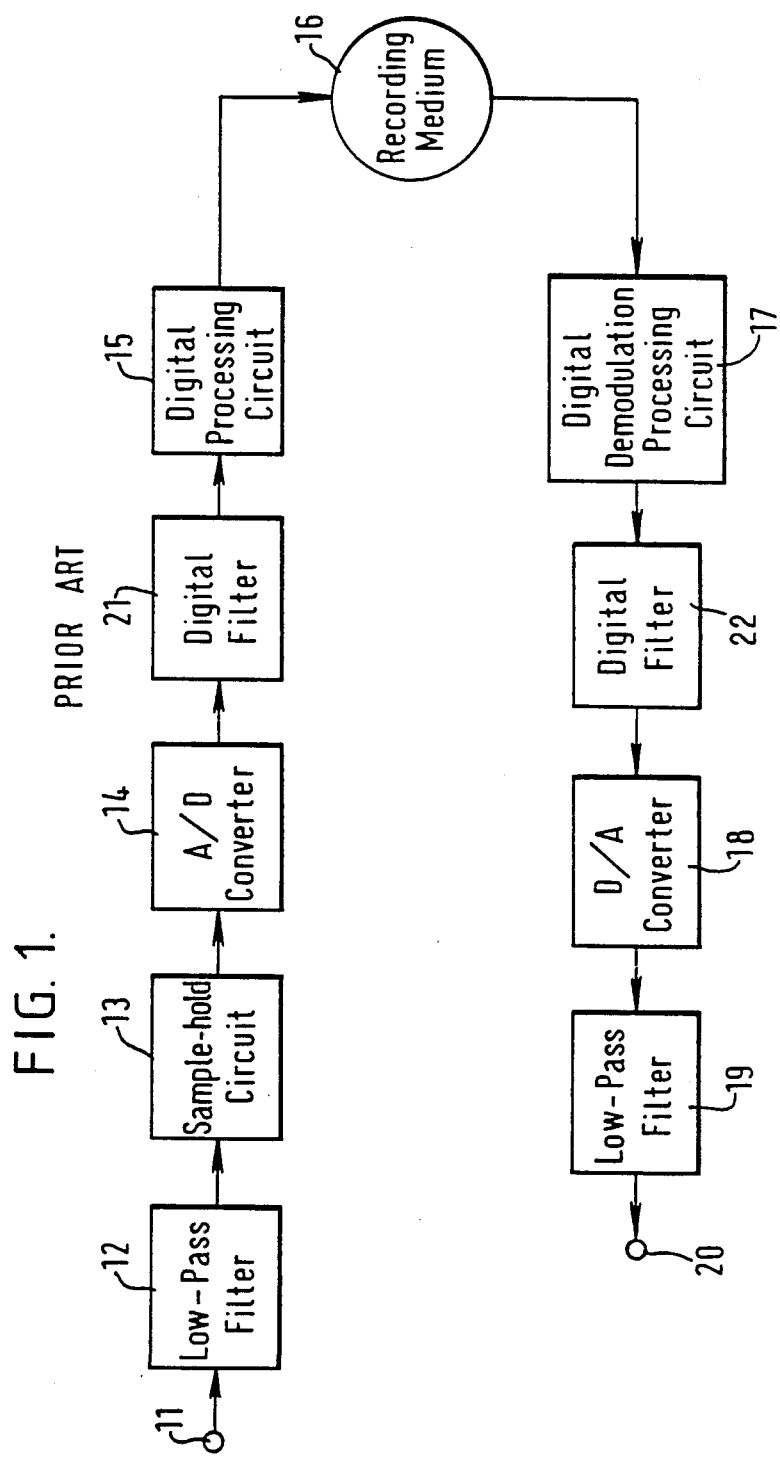
FIG. 1 is a block diagram of the essential construction of a prior art digital recording and play-back unit.
Figure 2:
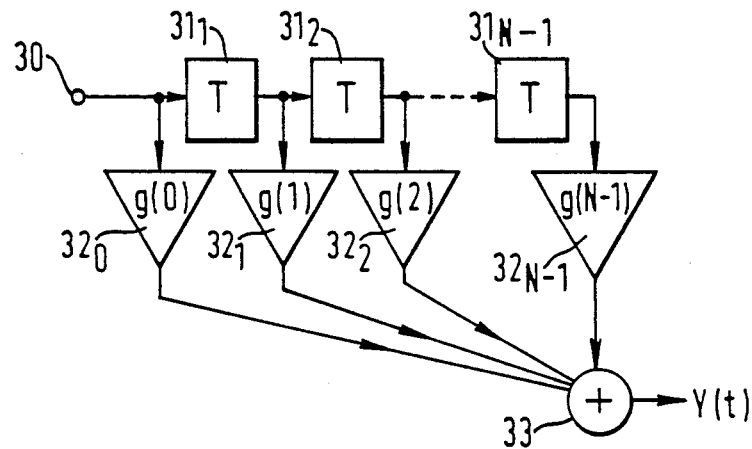
FIGS. 2 and 3 are circuit diagrams showing convolution arithmetic systems that have been previously proposed.
Figure 3:
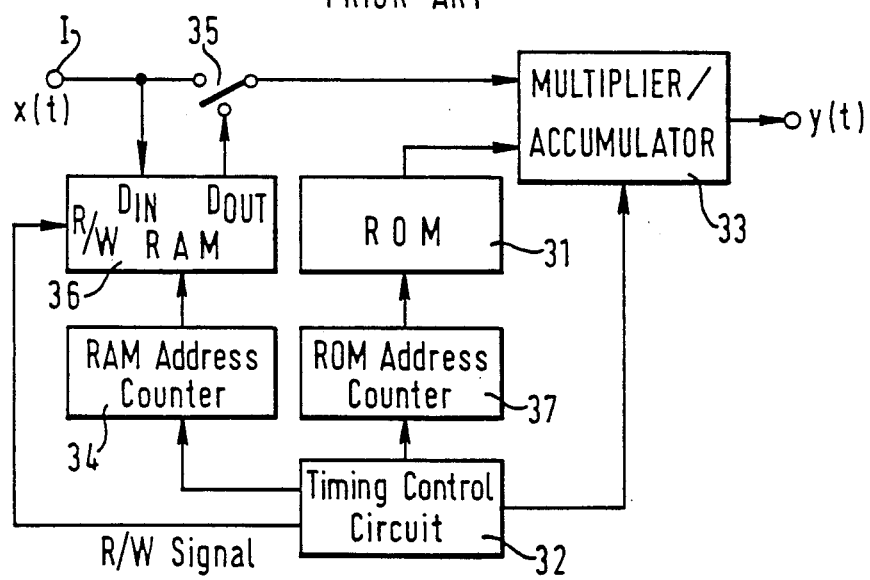
Figure 4:
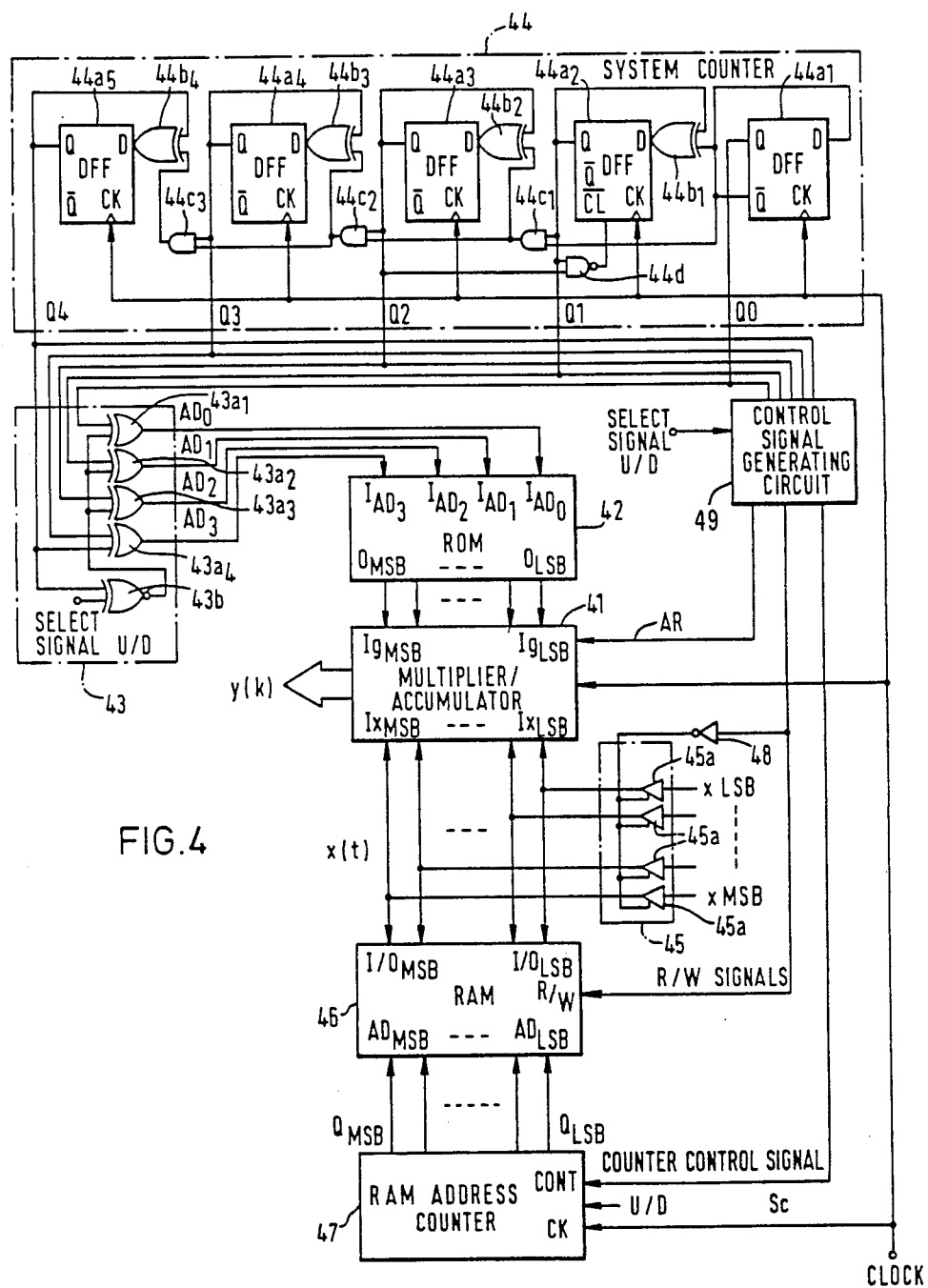
FIG. 4 is a circuit diagram of an embodiment of a convolution arithmetic circuit according to this invention.

FIG. 4 shows a circuit configuration of an embodiment of a convolution arithmetic circuit according to this invention. In this embodiment, the sampling frequency of the coefficient data g(k) is set at a prescribed value as described hereinafter. In FIG. 4, the set of input terminals $Ig_{LSB}$ to $Ig_{MSB}$ of an accumulator 41 is connected to the set of output terminals $O_{LSB}$ to $O_{MSB}$ of a ROM 42 that stores the coefficient data factors g(k). Address input terminals $IA_{D0}$ to $IA_{D3}$ of ROM 42 are connected to the output terminals of a system counter 44 through a ROM address altering circuit 43. System counter 44 is a scale-of-24 counter including five D-type flip-flops (DFF) $44a_1$ to $44a_5$ coupled with each other by exclusive-OR (EX-OR) gates $44b_1$ to $44b_4$, AND gates $44c_1$ to $44c_3$ and a NAND gate $44d$.

Another set of input terminals $Ix_{LSB}$ to $Ix_{MSB}$ of accumulator 41, to which the multiplicand data are applied receive, with the prescribed timing to be described subsequently, input signals x(t) (the data of each bit are $x_{LSB}$ to $x_{MSB}$) that are supplied from an external device through a gate 45 that has, arranged in parallel with it, a prescribed number of tri-state buffers 45a, corresponding to each bit. They are also connected to input/output (I/O) terminals I/O$_{LSB}$ to I/O$_{MSB}$ of a RAM 46, which holds a plurality of input signals constituting the multiplicand data. Address signals that are applied to address input terminals $AD_{LSB}$ to $AD_{MSB}$ of RAM 46 are generated by a RAM address counter 47 and supplied from its output terminals $Q_{LSB}$ to $Q_{MSB}$. RAM address counter 47 is a "scale-of-six" counter and may be configured as the RAM address counter described in aforementioned co-pending application Ser. No. 674,844, filed Nov. 26, 1984. A control signal generating circuit 49, also described in application Ser. No. 674,844, is connected to output terminals Q0 to Q4 of system counter 44 for generating a R/W signal, a counter control signal Sc and an accumulator reset signal AR. The disclosure of application Ser. No. 674,844 is incorporated by reference herein.

The R/W signal specifies the operating mode of RAM 46 and is applied directly to a mode change terminal R/W of RAM 46 and to gate 45 through an inverter 48. The R/W signal, when low (L), changes RAM 46 to a write-mode and permits the supply, to RAM 46 and multiplier/accumulator (M/A) 41, of the input signal x(t) that is then present at the input terminals of the tri-state buffer 45. While the R/W signal is high (H) RAM 46 is in read-mode and permits the supply, to M/A 41, of the signal stored in RAM 46. Gate 45 is disabled to prohibit the passage of the input signals x(t) to the input of M/A 41.

The counter control signal Sc is applied to a control terminal of RAM address counter 47 and changes the count mode of RAM address counter 47 in response to the state of the counter control signal Sc. RAM address counter 47 performs an ordinary counter operation, i.e., incrementing the count by 1 with every CLOCK signal, while the counter control signal Sc is at level L. However, when the counter control signal Sc is at level H the count of RAM address counter 47 is incremented by +2 for each CLOCK signal.

Since counter 44 is a scale-of-24 counter it has a 24-count sequence as follows: 0, 3, 2, 5, 4, 7, 8, 11, 10, 13, 12, 15, 16, 19, 18, 21, 20, 23, 24, 27, 26, 29, 28, 31. This sequence automatically repeats itself as long as clock pulses are applied. This is represented in the SYSTEM COUNTER line of FIG. 6a.

ROM address altering circuit 43 includes four EX-OR gates $43a_1$ to $43a_4$ and an inverted EX-OR gate $43b$. Inverted EX-OR gate $43b$ receives the output Q4 of system counter 44 and a select signal U/D. The control signal U/D is also applied to control signal generating circuit 49. EX-OR gate $43a_4$ also receives the output Q4 and receives as a second input the second most significant bit output Q3 of system counter 44. The rest of EX-OR gates $43a_1$ to $43a_3$ receive respectively the outputs Q0 to Q2 of system counter 44 as well as the output of inverted EX-OR gate $43b$. Outputs $AD_0$ to $AD_3$ of EX-OR gates $43a_1$ to $43a_4$ are respectively applied to input terminals $IAD_0$ to $IAD_3$ of ROM 42. When the output of X-OR $43b$ is "1", EX-OR's $43a_1$–$43a_4$ invert the Q0–Q3 outputs from counter 44. When EX-OR $43b$ is "0" the Q0–Q3 counter outputs are passed unchanged. As a result, the second twelve count states represented by the $AD_0$–$AD_3$ signals are a "mirror image" of the first twelve $AD_0$–$AD_3$ count states. This is illustrated in the "ROM ADDRESS" line of FIG. 6a.

OPERATION

The operation of the system will now be explained with reference to FIGS. 4–7b. ROM 42 stores twelve coefficient data factors g(k). However, twenty-four coefficient data factors are necessary for one convolution processing cycle in digital filtering. As shown in FIG. 5, the impulse response values 0–23 comprising the coefficient data factors present a symmetrical pattern such that each response in a symmetrical half is the same in amplitude as a corresponding one in the opposite symmetrical half. Accordingly, impulse response factors for one symmetrical half, in this case twelve impulse responses from the center of the symmetrical pattern, represent the coefficient data factors g(k) stored in ROM 42. The twenty-four coefficient data factors are stored at ROM addresses 0, 3, 2, 5, 4, 7, 8, 11, 10, 13, 12 and 15 as shown in FIG. 8.

Figure 6A:
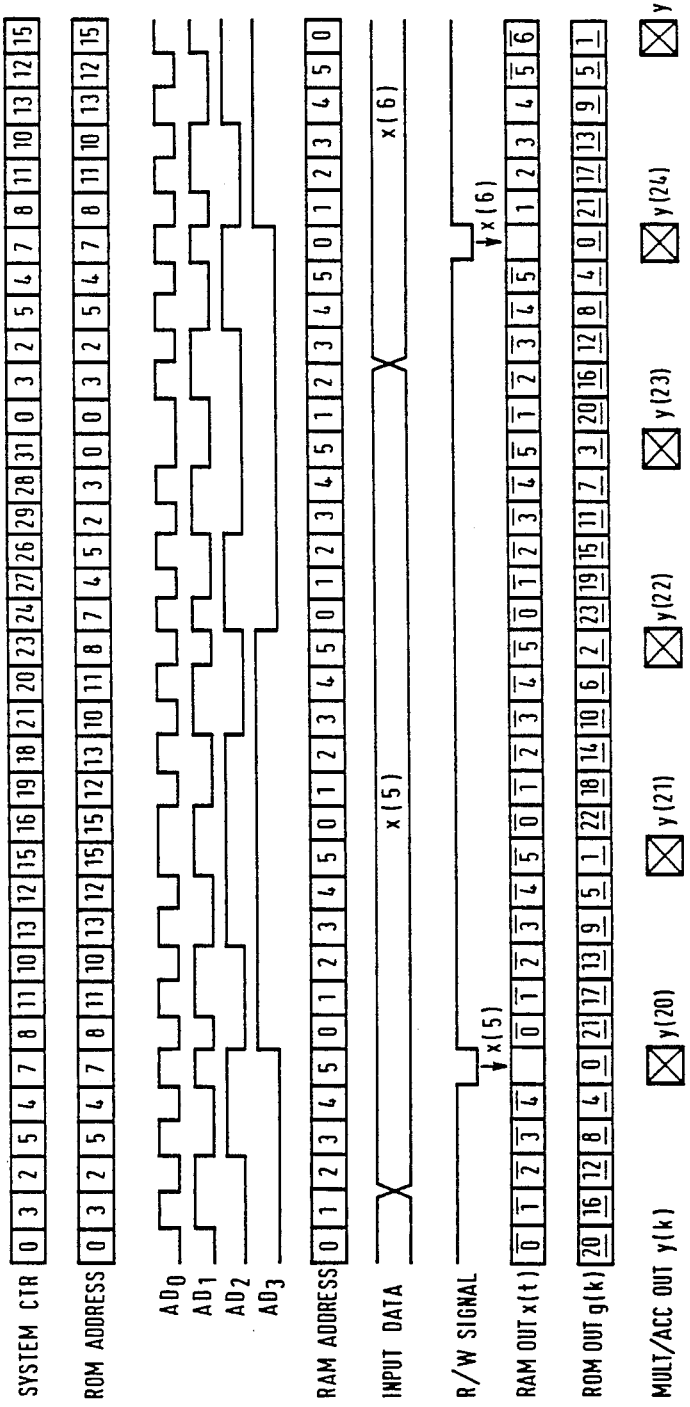
FIG. 6a is a timing diagram given in explanation of the operation of the FIG. 4 embodiment in response to select signal U/D being at the H level.

The outputs $AD_0$ to $AD_3$ of address altering circuit 43 respectively change as shown by signal waveforms $AD_0$ to $AD_3$ in FIG. 6a. The relationship of $AD_0$–$AD_3$ to the count of system counter 44 is indicated by comparing the SYSTEM CTR line of FIG. 6a with $AD_0$–$AD_3$. The ROM addresses generated by the outputs $AD_0$ to $AD_3$ for ROM 42 change as shown in the ROM address line of FIG. 6a. The relationship between the ROM addresses and the count of system counter 44 is represented by the diagram shown in FIG. 6b. Each of the ROM addresses 0 to 15 is generated twice in a cycle of the system counter 44 from 0 to 31. The twelve coefficient data factors g(k) corresponding to the ROM addresses 0–15 are therefore read out and supplied to M/A 41 twice during one cycle of the count of system counter 44. First the coefficient data factors g(k) corresponding respectively to the ROM addresses 0 to 15 are read in turn for the count of 0 to 15 and then the coefficient data factors g(k) corresponding to the ROM ADDRESSES 15 to 0 are read in turn for the count of 16 to 31.

On the other hand, the input signal x(t) is applied to input terminals $Ix_{MSB}$ to $Ix_{LSB}$ of M/A 41 from the RAM 46 or from an external device through gate 45. The convolution operation for the coefficient data g(k) and the input signal x(t) at M/A 41 is performed under control of the R/W signal and the counter control signal Sc generated from control signal generating circuit 49. The convolution arithmetic circuit of FIG. 4 increases the effective sampling frequency by a factor of 4 by performing calculations defined by the following equations in response to an H level U/D signal:

$$y(4t) = \sum_{j=0}^{5} g(4j) \cdot x(t - j)$$

$$y(4t + 1) = \sum_{j=0}^{5} g(4j + 1) \cdot x(t - j)$$

$$y(4t + 2) = \sum_{j=0}^{5} g(4j + 2) \cdot x(t - j)$$

$$y(4t + 3) = \sum_{j=0}^{5} g(4j + 3) \cdot x(t - j)$$

The convolution operation is executed four times while the input signal x(t) is sampled once, thereby making the effective sampling frequency of the output data y(t) four times the sampling frequency of the input signal x(t). Actually, the variable (4t+α) of the output y(4t+α) (where=0, 1, 2, 3) of the above equations is on the time domain, so the output data is, in fact, $y(^{4t+\alpha})$ with respect to the input data x(t), although the variable is expressed for convenience in integer form i.e., in the former form y(4t+α).

This convolution operation is described in connection with the timing diagram shown in FIG. 6a. Input signals received prior to x(5) are omitted. Each time the system counter reaches count "7" R/W signal goes to L to sample the next x(t) input and write it into RAM 46 while also supplying it to multiplier/accumulator 41. System counter 44 counts up in synchronism with the rising edge of the input clock signal CLOCK and the ROM address for ROM 42 changes from 0, 3, 2, ..., 15, and then from 15, 12 ..., 0 in accordance with the count of system counter 44 as mentioned before. With the same timing, the output of RAM address counter 47 is applied to address terminals $AD_{LSB}$ to $AD_{MSB}$ of RAM 46 to change its address (RAM address) from 0, 1, ..., 5, 0, 1, ..., 5. In this case, the twelve data factors g(20), g(16), g(12), g(8), g(4) g(0), g(21), g(17), g(13), g(9), g(5), and g(1) (expressed as $\underline{20}$, $\underline{16}$, etc. in FIG. 6a) which are stored in ROM 42 at the ROM addresses 0, 3, 2, 5, 4, 7, 8, 11, 10, 13, 12, 15, respectively, are read out forward and backward sequentially. The multiplicand data x(0) to x(4), expressed by $\overline{0-4}$, respectively, in the RAM OUT line of FIG. 6a, correspond to these coefficient data, and are stored in the RAM 46 at addresses 0 to 4 and are read out from RAM 46.

Multiplier/accumulator (M/A) 41 sequentially calculates the products of these coefficient data and multiplicand data and keeps a running total of the products. M/A 41 thus calculates g(20).x(0)+g(16).x(1)+ ... +g(4).x(4), etc.

While the count of system counter 44 is between "0" and "4", the R/W signal is at the H level. When the count of system counter 44 reaches "7", H level outputs $Q_0$ to $Q_2$ of system counter 44 are applied to control signal generating circuit 49, and the R/W signal switches to the L level, causing RAM 46 to change to write-mode and gate 45 in the high impedance state to be opened to allow the most recent input signal x(5) presently at the input of gate 45 to be written in the RAM address "5" of RAM 46.

The input signal x(5) is also supplied to M/A 41 in place of the output of RAM 46, and the input signal x(5) is multiplied by the coefficient data factor g(0) corresponding to the ROM address "7" and present at the ROM output. In this way, M/A 41 makes the final calculation for calculating the output data y(20) corresponding to the input signal x(5).

After the output data y(20) has been calculated, the R/W signal changes to the H level and RAM 46 returns to the read-mode. The read-mode resumes until the count of system counter 44 becomes "8". When this happens, the RAM addresses shift through 0, 1, ..., 5 under control of RAM address counter 47, causing the multiplicand data x(0), x(1), ..., x(5) corresponding to the RAM addresses to be read, the input signal x(5) in the preceding cycle having already been stored in the RAM address "5". The corresponding coefficient data factors g(21), g(17), g(13), g(9), g(5) and g(1) whose ROM addresses 8, 11, 10, 13, 12 and 15 are outputted from ROM 42, so multiplier/accumulator 41 calculates g(21).x(0)+g(17).x(1)+ ... +g(1).x(5). When the count of system counter 44 is "15", i.e., when the outputs $Q_0$ to $Q_2$ of system counter 44 again have become all H level, the accumulating output is latched to hold the output data $$y(21) = \sum_{j=0}^{5} g(4j + 1) \cdot x(5 - j).$$

These operations are carried out continuously. While the count of the system counter 44 is shifting from "16" through "23", the coefficient data factors g(22), g(18), ..., g(2) stored at ROM addresses 15, 12, ..., 8 are read out from ROM 42, and the multiplicand data x(0)–x(5) are read out from RAM 46 again in accordance with the address specified by RAM counter 47. M/A 41 therefore calculates g(22).x(0)+g(18).x(1)+ ... +g(2).x(5)

with the same timing as in the preceding stage, and delivers the output data $$y(22) = \sum_{j=0}^{5} g(4j + 2) \cdot x(5 - j).$$

These operations are also carried out continuously for the coefficient data factors g(23), g(19), ... g(3) and the multiplicand data x(0)–x(5) while the count of system counter 44 is shifting from "24" through "31", and the output data y(23)=g(4j+3).x(5-j) is produced.

In the above convolution operation, when the count system counter 44 is "31", all of the outputs Q0 to Q4 of system counter 44 become H level. The counter control signal Sc generated from control signal generating circuit 49 changes to the H level. Consequently, in RAM address counter 47, the next RAM address is incremented by +2 with respect to the previous address, shifting from "5" to "1".

In the following convolution calculation, therefore, while the ROM address counts shift from 0 through 4, the RAM address shifts from 1 to 5. Further, when the count of system counter 44 becomes "7", the R/W signal goes to the L level, and the next input signal x(6) is fed to RAM 46 and is stored at RAM address 0. Input x(6) is also fed to M/A 41. Multiplier/accumulator 41 therefore receives as its inputs the coefficient data factors g(20), g(16), ... g(0) and the multiplicand data x(1), x(2), ... , and x(6). M/A 41 calculates g(20).x(1)+g(16).x(2)+ ... +g(0).x(6), and delivers the output data y(24)=g(4j).x(6-j). For the succeeding calculations, the most recent input signal x(6) is stored in RAM 46 in place of the oldest data x(0). Thus, the multiplicand data read out from RAM 46 are the five most recently recieved input data bytes stored as of the time the count of the system counter 44 became "7".

After calculating the output data y(24) as above, the same sequence of operations occurs as when the series of convolution calculations was performed using the input signal x(6) and the coefficient data read out from the corresponding ROM addresses. The corresponding RAM addresses are repeated in the cycle 1, 2, ... 5, 0 every time the convolution calculation is performed in each of the stages until the count of system counter 44 again reaches "31". The multiplicand data are therefore successively read out as x(1), x(2), ... , x(6). Accumulator 41 performs the convolution calculation with x(6) as the most recent multiplicand data. The outputs $$y(25) = \sum_{j=0}^{5} g(4j + 1) \cdot x(6 - j), y(26) = \sum_{j=0}^{5} g(4j + 2) \cdot$$

$$x(6 - j), \text{ and } y(27) = \sum_{j=0}^{5} g(4j + 3) \cdot x(6 - j) \text{ are}$$

obtained when the count of system counter 44 reaches "15", "23", and "31", respectively.

When the count of system counter 44 again becomes "31" the counter control signal Sc changes to H level and the RAM address shifts from "0" to "2". When the count of system counter 44 becomes "7", the R/W signal goes to the L level and the most recent data x(7) is written in the RAM address "1" in place of the oldest multiplicand data x(1). Subsequent operation repeats the operation as previously described. The RAM address shifts by 1 every time the input signals x(t) are successively processed. The convolution algorithm is executed four times with the respective input signal constituting the most recent multiplicand data in each case.

Figure 7A:
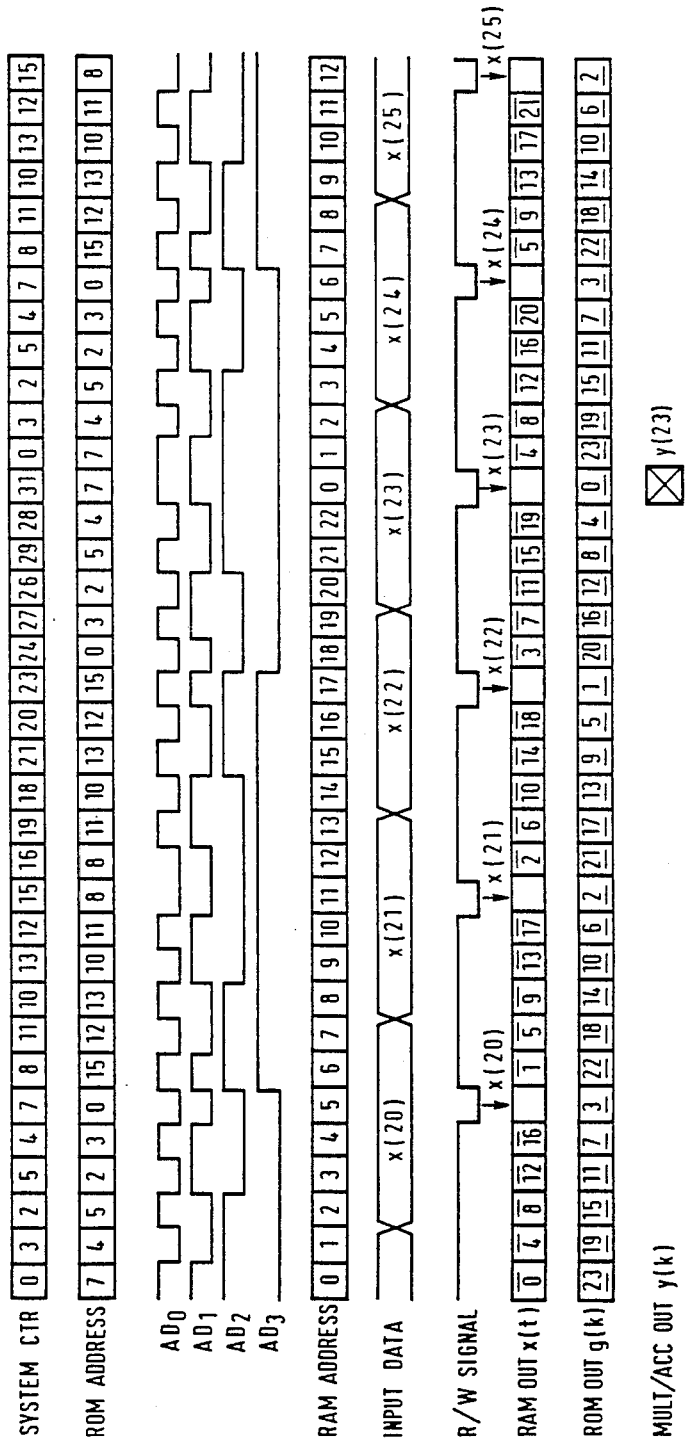
FIG. 7a is a timing diagram given in explanation of the operation of the FIG. 4 embodiment in response to select signal U/D being at the L level.

The operation of the convolution circuit of FIG. 4 with the select signal U/D being at the L level is explained hereinafter with respect to the modified operation illustrated in FIGS. 7a and 7b. The outputs $AD_0$ to $AD_3$ of address altering circuit 43 respectively change as shown in FIG. 7a according to the count illustrated in the SYSTEM CTR line. The ROM addresses produced by the outputs $AD_0$ to $AD_3$ change as shown in FIG. 7a at ROM Address. The relation of the ROM addresses with the count of system counter 44 is represented in the diagram of FIG. 7b. Each of the ROM addresses 0 to 15 is designated twice in a cycle of the count of system counter 44 from 0 to 31 similar to the cycle shown in FIG. 6b for the case when the select signal U/D is at the H level. But, the ROM addresses corresponding to the counts 0 to 7, 8 to 15, 16 to 23, and 24 to 31 in this case are replaced respectively with the ROM addresses corresponding to the counts 24 to 31, 16 to 23, 8 to 15, and 0 to 7 in the graph of FIG. 6b. The twelve coefficient data factors g(0) to g(11) are therefore read out and supplied to M/A 41 twice during one cycle of the count of system counter 44, according to the order of the ROM addresses as shown in the timing diagram of FIG. 7a. The U/D signal switches the RAM address counter to a "scale-of-23" counter that continuously cycles through a count of 0–22 (decimal equivalent) and repeats, as shown in FIG. 7a. Control signal $S_c$ does not function when U/D is at the low level.

The input signal x(t) is applied to input terminals $Ix_{MSB}$ to $Ix_{LSB}$ of M/A 41 from RAM 46 or an external device through gate 45. The convolution operation for the coefficient data g(k) and the input signal x(t) at M/A 41 is performed under control of the R/W signal and the counter control signal Sc generated from RAM control circuit 49. The convolution arithmetic circuit of FIG. 4 decreases the effective sampling frequency by a factor of ¼ when the select signal U/D is at the L level, performing calculations defined by the following equations:

$$y(4t - 1) = \sum_{j=0}^{23} g(t) \cdot x(4j - 1 - t)$$

The convolution operation is executed one time while the input signal x(t) is sampled four times, thereby making the effective sampling frequency of the output data y(t) one-fourth of the sampling frequency of the input signal x(t). Actually, the variable (4t−1) of the output data y(4t−1) of the above equations is in the time domain, so the output data is, in fact, $y(^{4t-1})$ with respect to the input data x(t), although the variable is expressed for convenience in integer form, i.e., in the former form y(4t−1).

This convolution is described with reference to the time-chart shown in FIG. 7a. The input signal prior to the stage of x(20) is partially omitted. System counter 44 counts up in synchronism with the rising edge of the input clock signal CLOCK and the address (sequence) for ROM 42 changes as shown in FIG. 7a at "ROM address". In this case, control signal generating circuit 49 changes the R/W signal to the L level every time system counter 44 advances six counts, i.e., 0 to 7, 8 to 15, etc., due to the select signal U/D being at the L level. Then, the input signals x(20), x(21), x(23) ... are stored continuously in RAM 46 at the respective RAM addresses "5", "11", "17" ... in place of the oldest data stored there. On the other hand, accumulator 41 delivers its convolution output when the timing system counter 44 reaches a count of "31". That is, accumulator 41 delivers:

$y(23) = g(23) \cdot x(0) + g(19) \cdot x(4) + g(15) \cdot x(8) +$ $g(11) \cdot x(12) + g(7) \cdot x(16) + g(3) \cdot x(20) + g(22) \cdot x(1) +$ $g(18) \cdot x(5) + g(14) \cdot x(9) + g(10) \cdot x(13) + g(6) \cdot x(17) +$ $g(2) \cdot x(21) + g(21) \cdot x(2) + g(17) \cdot x(6) + g(13) \cdot x(10) +$ $g(9) \cdot x(14) + g(5) \cdot x(18) + g(1) \cdot x(22) + g(20) \cdot x(3) +$ $g(16) \cdot x(7) + g(12) \cdot x(11) + g(8) \cdot x(15) + g(4) \cdot x(19) +$ $g(0) \cdot x(23)$ The detailed explanation of FIG. 7a for the operation during the select signal U/D being at the L level is omitted hereunder inasmuch as its operation may be understood from the explanation given above in connection with FIG. 6a, taking into consideration the above-mentioned basic differences in the count sequences and sampling frequency.

FIGS. 9-13 illustrate an alternate embodiment employing a different aspect of applicants' invention. The system shown in FIG. 9 employs a multiplier/accumulator 41, a RAM 46, RAM address counter 47, control signal generating circuit 49, and a system counter 44 identical to those same components shown and described above in connection with the FIG. 4 embodiment.

Figure 9:
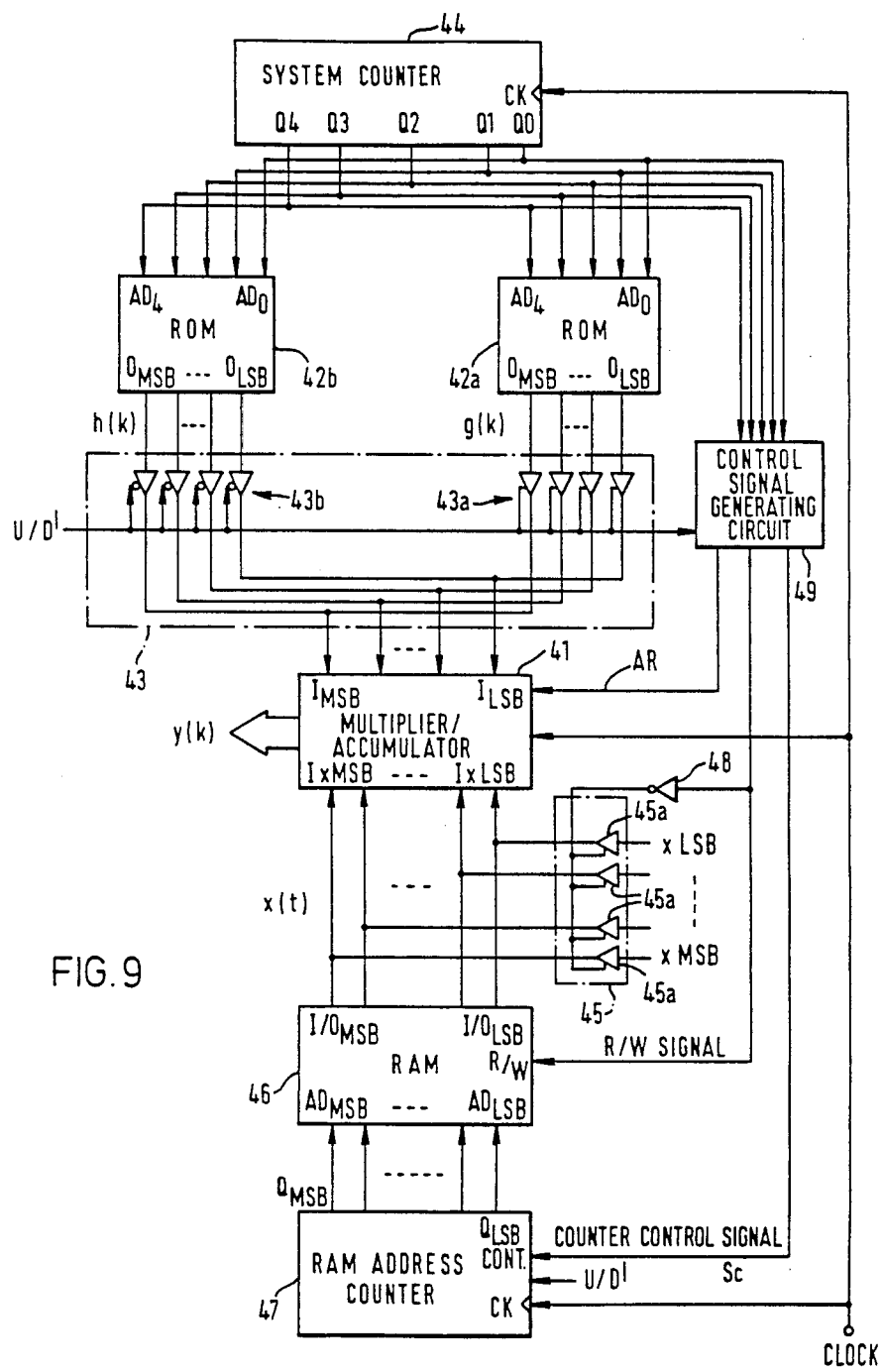
FIG. 9 is a schematic circuit diagram of an alternate embodiment of a convolution arithmetic circuit constructed in accordance with a different aspect of the invention.

However, instead of employing a single ROM, the FIG. 9 system employs a pair of ROMs 42a and 42b. Further, the count conversion circuit 43 employed in the FIG. 4 system is not utilized and, instead, the five output lines Q0-Q4 of scale-of-24 counter 44 are fed directly to the address inputs AD0-AD4 of the ROMs 42a and 42b. Accordingly, the ROMs are simultaneously addressed with a continuous sequence of 5-bit address signals progressing in accordance with the normal counter sequence of scale-of-24 counter 44. Each address signal presented to the ROMs 42a, 42b reads out of the accessed storage location one of the filter coefficient data factors stored therein. The data factor values stored in the ROMs are the same as those depicted in connection with FIG. 5. However, all 24 data factors 0-23 are stored at individual storage locations in each of the ROMs. FIG. 10 shows the storage locations of ROM 42a and the particular g(k) factor stored therein. FIG. 11 shows the storage locations of ROM 42b and the particular g(k) data factor stored therein.

Selection signal U/D' shown in FIG. 9 operates a pair of gate circuits 43a and 43b to activate either the outputs from ROM 42a or the outputs from ROMs 42b, depending upon the state (H or L) of the U/D' signal. When U/D' is high, gates 43a are enabled such that the outputs from ROM 42a are fed to the inputs $I_{LSB}$-$I_{MSB}$ of multiplier/accumulator 41 in response to the progression of system counter 44. Gates 43b are disabled and the outputs from ROM 42b are not utilized. However, when U/D' is at the L level, the opposite condition prevails and the outputs from ROM 42b are fed to the inputs $I_{LSB}$-$I_{MSB}$ of multiplier/accumulator 41.

Figure 12:
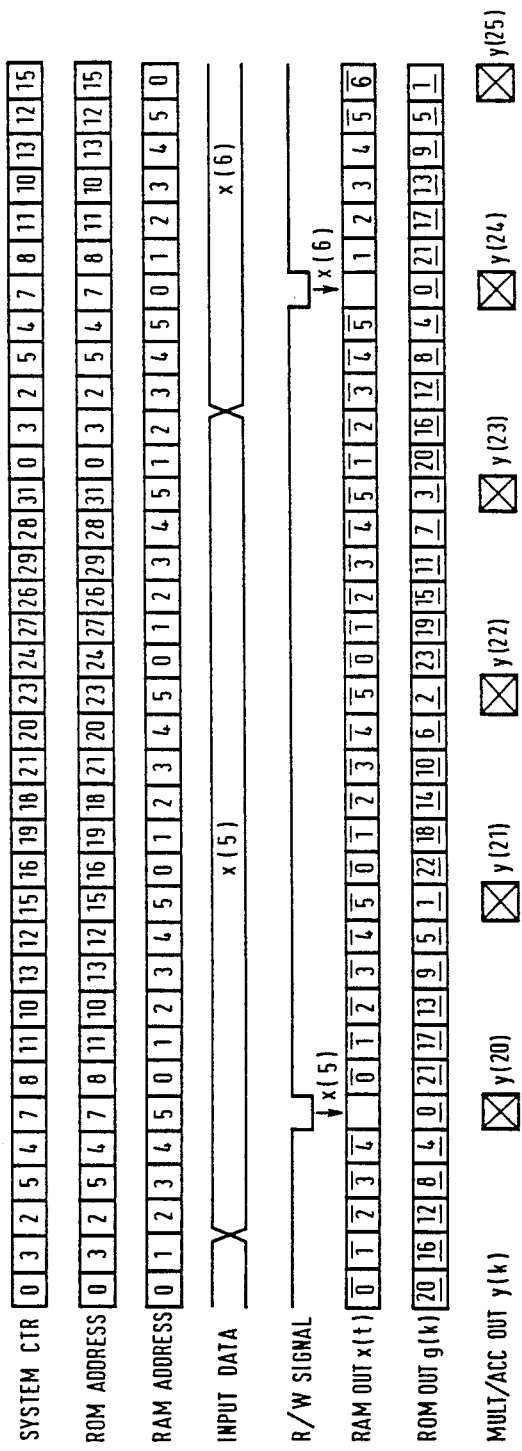
FIG. 12 is a timing diagram illustrating the operation of the FIG. 9 embodiment in response to select signal U/D' being at the H level.
Figure 13:
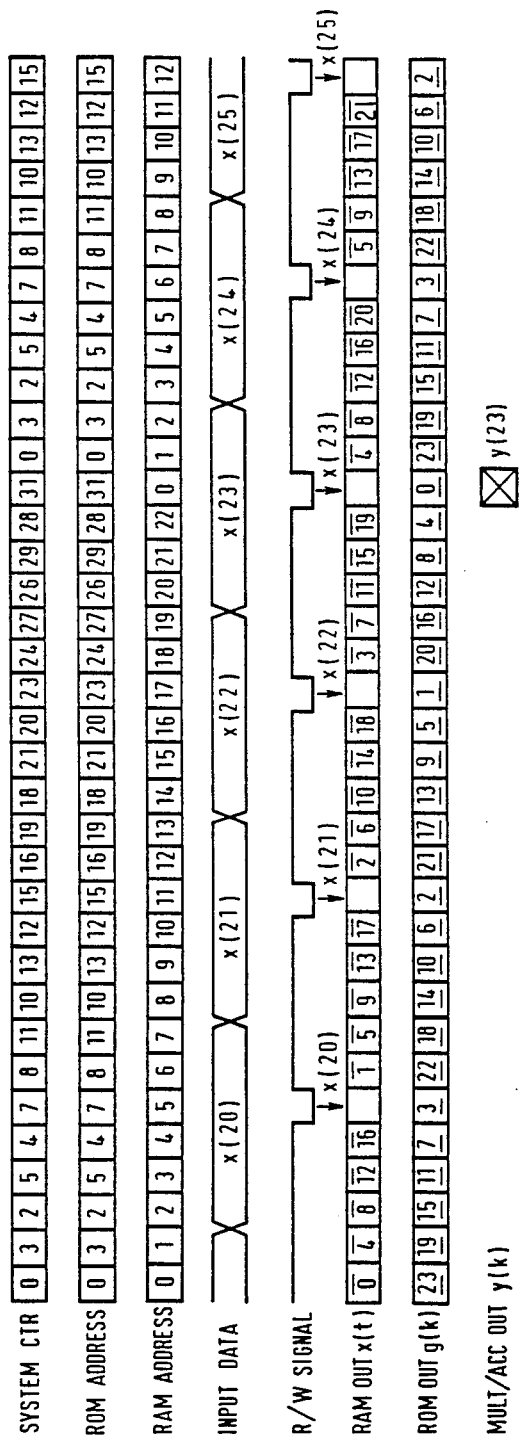
FIG. 13 is a timing diagram illustrating the operation of the FIG. 9 embodiment in response to select signal U/D' being at the L level.

As shown in FIGS. 12 and 13, the system operation achieved by the circuit of FIG. 9 is identical with the operation achieved in the circuit of FIG. 4 for the two states of the U/D signal. When the U/D' is at the H level, the FIG. 9 system performs digital filtering at the high sampling rate identically with the operation previously described in connection with FIG. 6a. While the operation depicted in FIG. 12 indicates that the ROM addresses sequence in sync with the outputs of the system counter, the outputs from the ROM 42a are exactly the same as the ROM outputs of the FIG. 4 system (FIG. 6a), whereupon the same filtering function and sampling rate operation are achieved.

When U/D' of the FIG. 9 system is at the L level, operation identical to that previously described in connection with FIG. 7a is achieved. Again, as shown in FIG. 13, the sequence of ROM addresses is synched to the output of system counter 44 but since the filtering coefficient data factors stored in ROM 42b produce a ROM output identical to that illustrated in connection with FIG. 7a, the identical low sampling frequency operation previously described in connection with FIG. 7a is achieved. As shown in FIG. 13, the RAM address counter 46 functions as a "scale-of-23" counter at this time, just as in the case of the operation depicted in FIG. 7a.

It will be appreciated that various additional changes in the form and details of the above-described preferred embodiments may be effected by persons of ordinary skill without departing from the true spirit and scope of the invention.

What is claimed is:

1. A convolution arithmetic circuit comprising:
   first memory means for storing a first data sequence;
   second memory means for storing a second data sequence determined from an input signal;
   first counter means providing cycles of count data, each said cycle including a sequence of non-repeating counts;
   second counter means providing a series of addresses for said second memory;
   multiplying/accumulating means for computing a series of products by multiplying elements of said first data sequence read from said first memory means by elements of said second data sequence read from said second memory means and for determining the sum of said products; and
   means for transforming each said cycle of said count data into a series of addresses for said first memory means, each said series of addresses including a sequence wherein at least one address is generated twice.

2. The convolution arithmetic circuit of claim 1 wherein said means for transforming includes means for providing said series of addresses such that each address occurs therein twice during one cycle of said count data.

3. The convolution arithmetic circuit of claim 1 wherein said means for transforming includes means for providing said series of addresses such that during one cycle of said count data a first address sequence is generated in said series of addresses and is then repeated in reverse order.

4. The convolution arithmetic circuit according to claim 1 wherein said second memory has a data storage capacity of one half of said first memory.

5. The convolution arithmetic circuit according to claim 4 further comprising control signal generating means for generating a control signal to change the sampling frequency of said accumulating means.

6. The convolution arithmetic circuit according to claim 5 further comprising:
   means for altering the order of said series of addresses for said first memory.

7. The convolution arithmetic circuit according to claim 6 wherein said address order altering means and said control signal generating means operate synchronically.

8. A convolution arithmetic circuit comprising:
   first memory means for storing a first data sequence;
   second memory means for storing a second data sequence;
   third memory means for storing a third data sequence determined from an input signal;
   first counter means providing a series of first addresses for said first and second memory means;
   second counter means providing a series of second addresses for said third memory means;
   selection means for selectively supplying an output representing either said first or said second data sequence read from said first or second memory means in response to said first addresses; and
   multiplying/accumulating means for computing a series of products by multiplying elements of said third data sequence read from said third memory by said data sequence supplied by said selection means and for determining the sum of said products.

* * * * *